(12) United States Patent
Li

(10) Patent No.: US 10,720,327 B2
(45) Date of Patent: Jul. 21, 2020

(54) METHOD AND DEVICE FOR MANUFACTURING SEMICONDUCTOR SUBSTRATE

(71) Applicant: HONG WU YES ENGINEERING TECHNOLOGY RESEARCH INSTITUTE CO., LTD., Beijing (CN)

(72) Inventor: Guangwu Li, Beijing (CN)

(73) Assignee: HONG WU YES ENGINEERING TECHNOGOLOGY RESEARCH INSTITUTE CO., LTD., Beijing (CN)

( * ) Notice: Subject to any disclaimer, the term of this patent is extended or adjusted under 35 U.S.C. 154(b) by 0 days.

(21) Appl. No.: 16/133,638

(22) Filed: Sep. 17, 2018

(65) Prior Publication Data

US 2019/0035627 A1 Jan. 31, 2019

Related U.S. Application Data

(63) Continuation of application No. PCT/CN2016/078658, filed on Apr. 7, 2016.

(30) Foreign Application Priority Data

Mar. 18, 2016 (CN) .......................... 2016 1 0158724

(51) Int. Cl.
*H01L 21/02* (2006.01)
*C23C 4/04* (2006.01)
(Continued)

(52) U.S. Cl.
CPC .......... *H01L 21/02625* (2013.01); *C23C 4/04* (2013.01); *C23C 4/12* (2013.01);
(Continued)

(58) Field of Classification Search
CPC .... C01B 33/037; H01L 21/02625; C23C 4/00
See application file for complete search history.

(56) References Cited

U.S. PATENT DOCUMENTS 4,003,770 A * 1/1977 Janowiecki ............... C23C 4/04
438/97
4,449,286 A 5/1984 Dahlberg
(Continued)

FOREIGN PATENT DOCUMENTS

DE 2945450 A1 5/1981
GB 2061000 A 5/1981
(Continued)

OTHER PUBLICATIONS

Duan, Gangfu, "High Performance Crystalline Silicon Solar Cell Technology—Design, Manufacture, Test, and Power Generation" China Machine Press, Machine Branch; ISBN: 978-7-111-44730-6; (Oct. 2013); pp. 3-5.

(Continued)

*Primary Examiner* — Alia Sabur
(74) *Attorney, Agent, or Firm* — J.C. Patents

(57) ABSTRACT

This disclosure provides a method and a device for manufacturing a semiconductor substrate. The method for manufacturing a semiconductor substrate comprises the following steps: heating a semiconductor material to a molten state to obtain a molten semiconductor material; thermally spraying the molten semiconductor material onto a baseplate by using a thermal spraying gun, then cooling to solidify the molten semiconductor material on the baseplate to obtain the semiconductor substrate. The disclosed method offers, when manufacturing the semiconductor substrate, high material utilization, low manufacturing cost, and the ability to manufacture larger semiconductor substrate, with controllable thickness and high purity, providing broad application prospects.

5 Claims, 2 Drawing Sheets

(51) Int. Cl.
*C23C 4/12* (2016.01)
*C23C 4/123* (2016.01)
*C23C 4/137* (2016.01)
*C23C 4/18* (2006.01)
*H01L 21/67* (2006.01)

(52) U.S. Cl.
CPC .............. *C23C 4/123* (2016.01); *C23C 4/137* (2016.01); *C23C 4/18* (2013.01); *H01L 21/67109* (2013.01)

(56) References Cited

U.S. PATENT DOCUMENTS

| | | | | |
|---|---|---|---|---|
| 5,182,091 | A | * | 1/1993 | Yuge ..................... C01B 33/037 204/164 |
| 2010/0178435 | A1 | * | 7/2010 | Ervin ........................ C23C 4/04 427/569 |
| 2010/0304035 | A1 | * | 12/2010 | Zehavi ..................... C23C 4/02 427/450 |
| 2013/0298822 | A1 | * | 11/2013 | Komatsu ................. C01B 33/02 117/81 |

FOREIGN PATENT DOCUMENTS

| | | |
|---|---|---|
| JP | S6072376 A | 5/1985 |
| JP | 2005072462 A | 3/2005 |

OTHER PUBLICATIONS

The Chinese First Examination Report of corresponding Chinese application No. 201610158724.8, dated Oct. 10, 2017.
The extended European Search Report of corresponding European application No. 16893969.2-1108/3431626, dated Jul. 26, 2019.
Notice of Allowance of corresponding KR application.

* cited by examiner

METHOD AND DEVICE FOR MANUFACTURING SEMICONDUCTOR SUBSTRATE

CROSS-REFERENCE TO RELATED APPLICATIONS

This application is a continuation of International Application No. PCT/CN2016/078658, filed on Apr. 7, 2016, which claims priority to Chinese Patent Application No. 201610158724.8, filed on Mar. 18, 2016. The disclosures of the aforementioned applications are hereby incorporated by reference in their entireties.

TECHNICAL FIELD

This disclosure relates to manufacturing technology of semiconductor substrates and, in particular, to a method and a device for manufacturing a semiconductor substrate.

BACKGROUND

At present, traditional fossil fuel has always occupied a major part of the energy supply. However, with the emergence of the problems such as diminishing fossil fuel reserve, the increasing difficulty in mining and the great impact on the environment, it is urgent to develop new energy sources.

The semiconductor substrate is a substrate made of a semiconductor material, which is widely used in the fields of integrated circuits, photovoltaic power generation, and the like. As one of the most widely used semiconductor materials, silicon is abundant in reserves and easy to mine. Therefore, silicon-based solar power generation technology has great potential for development.

At present, semiconductor substrates are often manufactured from silicon by a drawing process, which has large energy consumption and heavy environmental pollution. Moreover, the process requires slicing a semiconductor substrate to produce a monolithic, which tend to cause waste of semiconductor materials and low utilization of materials. At the same time, the semiconductor substrate manufactured by this process has a small size, causing challenges when forming large-size semiconductor substrate. In addition, the semiconductor substrate thus produced is often thick and high in impurities, at a high manufacturing cost. Moreover, flexible semiconductor substrate cannot be produced. The above defects have greatly impaired the development of the semiconductor industry.

SUMMARY

This disclosure provides a method and a device for manufacturing a semiconductor substrate, offering high material utilization and low manufacturing cost. The semiconductor substrate manufactured by the method and the device can have large size, controllable thickness and high purity. Moreover, flexible semiconductor substrates can be manufactured, promising broad application prospects.

This disclosure provides a method for manufacturing a semiconductor substrate, including the following steps:

heating a semiconductor material to a molten state to obtain a molten semiconductor material;

thermally spraying the molten semiconductor material onto a baseplate by using a thermal spraying gun, then cooling to solidify the molten semiconductor material on the substrate to obtain the semiconductor substrate.

In this disclosure, the semiconductor material is not specifically limited, and may be any conventional material in the art, such as elemental semiconductors, inorganic compound semiconductors, organic compound semiconductors, amorphous and liquid semiconductors, including but not limited to polysilicon, germanium, selenium, gallium arsenide, cadmium telluride, cadmium arsenide, zinc oxide, etc. It can be understood that the semiconductor material shall be heated to a temperature higher than the molten point temperature of the semiconductor material to advantageously enable obtaining the molten semiconductor material. In particular, the heating temperature may be 100-400° C. higher than the molten point temperature of the semiconductor material. For example, when the molten point of the semiconductor material to be processed is T, the heating temperature may be (T+100) to (T+400) ° C., and more preferably (T+200) to (T+300) ° C.

In this disclosure, the thermally spraying is referring to a process in which molten semiconductor material is atomized and sprayed onto a surface of a baseplate, then cooled, solidified and settled down to form a film or a substrate. During the thermally spraying, the environment temperature should be above the molten point of the semiconductor material, thereby facilitating the spraying of the semiconductor material. In addition, the environment should be dust-free to advantageously ensure the purity of the semiconductor substrate. In particular, a dust-proof net provided with an adhesive layer can be used for dust removal, and the adhesive layer can, for example, be formed by coating with molten glass or heat-resistance epoxy resin.

The thermal spraying gun of this disclosure is used for atomizing the molten semiconductor material to spray the material onto the surface of the baseplate. The thermal spraying gun will not be specifically limited, except that it should be able to withstand high temperature and provide uniform atomization, and may be a contact type or non-contact type thermal spraying gun, such as a pneumatic thermal spraying gun, airless thermal spraying gun, rotary-cup thermal spraying gun, etc. In particular, when gas is used for the atomization, the gas should be an inert gas, including but not limited to argon, helium, neon, etc., or circulating gas in the sealed cavity. The temperature should be higher than the molten point of the semiconductor material, thereby facilitating the spraying of the semiconductor material.

In this disclosure, the baseplate is used to receive the semiconductor material, that is, the molten semiconductor material sprayed from the thermal spraying gun will drop on the baseplate. It can be understood that the surface of the baseplate should be flat and smooth and be able to withstand a temperatures above the molten point of the semiconductor material. The material of the baseplate is not specifically limited herein, and may be, for example, any heat-resistance metal or non-metal material.

In addition, in view of the fact that high temperature tend to be dissipated faster during the process of the thermally spraying, and from the perspective of energy saving, a thermal insulation material with low thermal conductivity and long service life can be used to thermally insulate the inside and/or outside of the equipment involved in implementing the thermally spraying in order to save energy and reduce energy consumption.

This disclosure adopts the thermal spraying method to prepare the semiconductor substrate, a method that has no specific requirements on the size of the baseplate, that is, the size of the manufactured semiconductor substrate is not limited, and can be set as needed. In particular, a semiconductor substrate with a large size can be manufactured. In addition, the method of this disclosure can also manufacture semiconductor substrates with various thicknesses according to specific requirements. In particular, a semiconductor substrate with a thickness of 50 μm or less can be manufactured. In this case, the semiconductor substrate is flexible and has a wide application spectrum. The method of this disclosure does not require slicing, thus no semiconductor material will be wasted, and the material utilization will be high, advantageously reducing the manufacturing cost.

In the method of this disclosure, seed crystal may be pre-laid on the baseplate. For example, the seed crystal may be laid on one end of the baseplate. When the thermally spraying is being performed, the molten semiconductor material spraying may begin from the end with the seed crystal and move on to the other end of the baseplate, so that the molten semiconductor material forms crystals during the process of the cooling and solidifying.

The relevant process control parameters of the thermal spraying of this disclosure is not specifically limited herein, and can be reasonably set according to the relevant parameters of the material, and/or the size, thickness and the like of the semiconductor substrate to be manufactured. For example, the thermally spraying can be controlled to a rate of 0.1-0.5 L/s, that is, 0.1-0.5 L of the molten semiconductor material is sprayed per second.

Further, the cooling can be controlled to a rate of 0.1-10° C./min. The method of the cooling is not specifically limited herein, and may be, for example, continuous cooling, gradient cooling, and the like. In particularly, when the semiconductor material is silicon, the cooling rate can be controlled to 0.2-2° C./min; when the semiconductor material is zinc oxide, the cooling rate can be controlled to 5-10° C./min; and when the semiconductor material is other compound material such as gallium arsenide, cadmium telluride or cadmium arsenide etc., the cooling rate can be controlled to 1-5° C./min. In a specific solution of this disclosure, for example, a heating device which supports temperature-control can be disposed below the baseplate to achieve the heating and cooling of the substrate.

In the method of this disclosure, before the cooling is performed, an inert gas at a temperature higher than the molten point of the semiconductor material can be blown onto the molten semiconductor material on the baseplate for purification. The inert gas is blown onto the semiconductor substrate to remove impurities, thereby improving the purity of the semiconductor substrate. It can be understood that the substrate should not be exposed during the blowing. The method of the blowing is not specifically limited herein, and can, for example, be blown outwardly, oscillated, or the like.

In this disclosure, the thermal spraying gun and the baseplate should be able to move relative to each other to achieve continuously uniform spraying. For example, when the thermal spraying is being performed, the thermal spraying gun or the baseplate may be continuously moved at a speed of 0.1-2 m/min. In particularly, when the semiconductor material is silicon, the speed of continuous movement may be 0.1-0.5 m/min; when the semiconductor material is a compound material such as gallium arsenide, cadmium telluride or cadmium arsenide etc., the speed of continuous movement may be 0.5-2 m/min.

Further, the method of this disclosure may further include photo-etching, or applying anti-reflection, on the semiconductor substrate. The photo-etching or anti-reflection process may be performed according to any conventional way in the art. The photo-etching is used to form nano-meshes on the semiconductor substrate, such as nano-meshes having side lengths of 10 to 50 nm. The photo-etched or anti-reflected semiconductor substrate can be formed directly into an unpackaged cell or form a packaged cell after being packaged in glass.

This disclosure also provides a device for manufacturing semiconductor substrate, the device including a sealed cavity, and a first heating portion, a thermal spraying gun and a bearing portion disposed inside the sealed cavity, An outlet end of the thermal spraying gun is disposed below an outlet end of the first heating portion, and the thermal spraying gun is movable relative to the bearing portion.

The bearing portion has a baseplate, and a second heating portion for heating the baseplate. The substrate is disposed below the thermal spraying gun.

In this disclosure, the sealed cavity is used to provide a sealed, dust-free, and heat-insulated environment for the thermally spraying. The temperature inside the sealed cavity should be higher than the molten point of the semiconductor material in order to facilitate the spraying of the semiconductor material. In addition, a thermal insulating layer may be disposed on the inner wall and/or the outer wall of the sealed cavity, thereby saving energy and reducing energy consumption.

In addition, the manner in which the thermal spraying gun is moved relative to the bearing portion is not specifically limited herein. For example, the bearing portion may be fixed and the thermal spraying gun is moved relative to the bearing portion, or the thermal spraying gun may be fixed and the bearing portion is moved relative to the thermal spraying gun. In the case where the bearing portion is to be moved, a plurality of rollers may be disposed at intervals beneath the bottom of the bearing portion.

The second heating portion of this disclosure is used for heating the baseplate. In an embodiment, the second heating portion may include a heating chamber and a plurality of heating rods, where the heating chamber is disposed below the baseplate, the plurality of heating rods are sequentially disposed inside the heating chamber along the length direction of the substrate. In this embodiment, the temperature of each heating rod can be individually adjusted and controlled to facilitate the cooling operation.

Further, the device of this disclosure may further include a blowing portion disposed above the baseplate, where the blowing portion has a blowing pipe and a blowing head disposed at one end of the blowing pipe, and the blowing head has a blowing nozzle disposed obliquely outward. The blowing portion of this arrangement can blow impurities off the semiconductor substrate outward.

In another embodiment, the device of this disclosure may further include a blowing portion disposed above the substrate, the blowing portion having a blowing pipe and a blowing head disposed at one end of the blowing pipe. The blowing head can oscillate relative to the blowing pipe. The blowing portion of this arrangement is capable of oscillating and blowing impurities off the semiconductor substrate.

Further, the device of this disclosure may further include a fan, an air inlet pipe and a dust removing portion, where one end of the air inlet pipe is connected to the fan, and the other end of the air inlet pipe is communicated to the sealed cavity, and the dust removing portion is disposed on the air inlet pipe. The fan, the air inlet pipe and the dust removing portion are arranged to ensure a dust-free environment inside the sealed cavity.

This disclosure does not specifically limit the structure of the dust removing portion, and any conventional dust removing device in the art can be included. In one embodiment, the dust removing unit has a casing and a plurality of dust removing nets stacked within the casing, and an adhesive layer is disposed on the dust removing net. This arrangement has a good dust removal effect.

The method and device of this disclosure have low energy consumption, no environmental pollution and green when manufacturing a semiconductor substrate, which does not cause waste of semiconductor materials, offering high material utilization and low manufacturing cost. The cost can be only ⅙ of the traditional drawing process. In addition, the semiconductor substrate manufactured by the method and the device is not limited in size. In particular, larger substrate can be manufactured, and the thickness of the semiconductor substrate can be controlled, especially for manufacturing flexible substrate having a thickness of less than 50 μm. The manufactured semiconductor substrate has less impurity, with a purity of up to 13-15 "9"s (that is, there are 13-15 "9"s after the decimal point of 99.). The manufactured semiconductor substrate has high yield, strong market competitiveness, and broad application prospects.

| Description of the reference signs | | |
|---|---|---|
| 1: Sealed chamber; | 2: First heating portion; | 3: Thermal spraying gun; |
| 4: Baseplate; | 5: Second heating portion; | 51: Heating chamber; |
| 52: Heating rod; | 6: Roller. | |

DESCRIPTION OF EMBODIMENTS

In order to make the objectives, technical solutions and advantages of this disclosure clearer, the technical solutions in the embodiments of this disclosure will be clearly and fully described in conjunction with the drawings and embodiments of this disclosure. It is obvious that the described embodiments are only some of the embodiments of this disclosure, rather than all of them. All other embodiments obtained by those skilled in the art based on the embodiments of this disclosure without creative effort are within the scope of this disclosure.

The environment and apparatus for manufacturing the semiconductor substrate are as follows:

Environment: a sealed process chamber that is thermally insulated and dust-free, in which the temperature is higher than the molten point of the semiconductor material. The inner and outer walls of the process chamber are provided with insulation panels for the thermal insulation.

Thermal spraying gun: a contact type or non-contact type spraying gun with heat resistance and uniform atomization. When atomizing with gas, the gas should be heated to a temperature above the molten point of the semiconductor material.

Baseplate: heat resistant metal or non-metal material capable of withstanding temperatures above the molten point of the semiconductor material. The baseplate shall have a flat and smooth surface.

Embodiment 1

Figure 1:
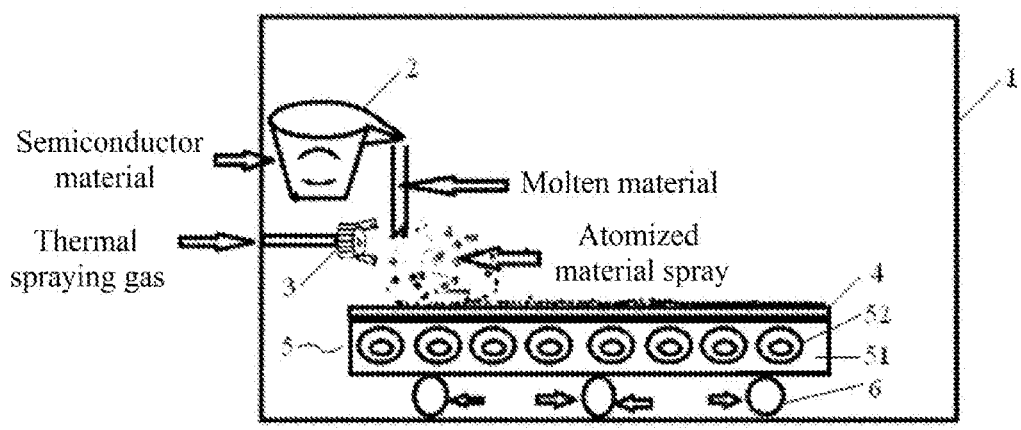
FIG. 1 is a schematic view of a method for manufacturing a semiconductor substrate according to an embodiment of this disclosure.

As shown in FIG. 1, in a sealed cavity 1 having a temperature of about 1800° C., polysilicon is heated to about 1800° C. by a first heating portion 2, putting the polysilicon in a molten state.

Monosilicon is pre-laid on one end (left end) of the baseplate 4. The baseplate 4 is heated by a second heating portion 5. Heating rods 52 in the heating chamber 51 are controlled individually during the heating, so that the portion of the baseplate 4 receiving the molten silicon is at a temperature of about 1800° C. Then, the molten silicon is thermally sprayed onto the baseplate 4 by the thermal spraying gun 3 at a spraying rate of about 0.3 liter per second (L/s) while the molten silicon is being extended from the end of the baseplate 4 laid with the monosilicon, and the baseplate 4 is continuously moved by rollers 6 at a speed of about 0.3 m/min.

Inert gas having a temperature of about 1800° C. is blown onto the molten silicon on the baseplate 4. After the impurities are blown off the baseplate 4, each of the heating rods 52 is controlled to be gradually cooled down at a rate of about 1 Celsius per minute (° C./min) to gradually solidify the molten silicon on the baseplate 4, so that crystals may be formed during the solidification process to produce a flexible silicon substrate having a thickness of 50 μm and a purity of 15 "9"s (that is, there are 15 "9"s after the decimal point of 99.) Further, the flexible silicon substrate can also be photo-etched or anti-reflected.

Embodiment 2

In a process chamber having a temperature of about 1600° C., gallium arsenide is heated to about 1600° C. to put the gallium arsenide in a molten state.

The molten gallium arsenide is thermally sprayed onto a baseplate by a thermal spraying gun at a spraying rate of about 0.5 L/s while the baseplate is being continuously moved at a speed of about 1 meter per minute (m/min).

Inert gas having a temperature of about 1600° C. is blown onto the molten gallium arsenide on the baseplate. After the impurities are blown off the baseplate, the temperature is gradually cooled down at a rate of 3° C./min to gradually solidify the molten gallium arsenide on the baseplate, producing a gallium arsenide substrate having a thickness of 100 μm and a purity of 13 "9" (that is, there are 13 "9"s after the decimal point of 99.).

Embodiment 3

Figure 2:
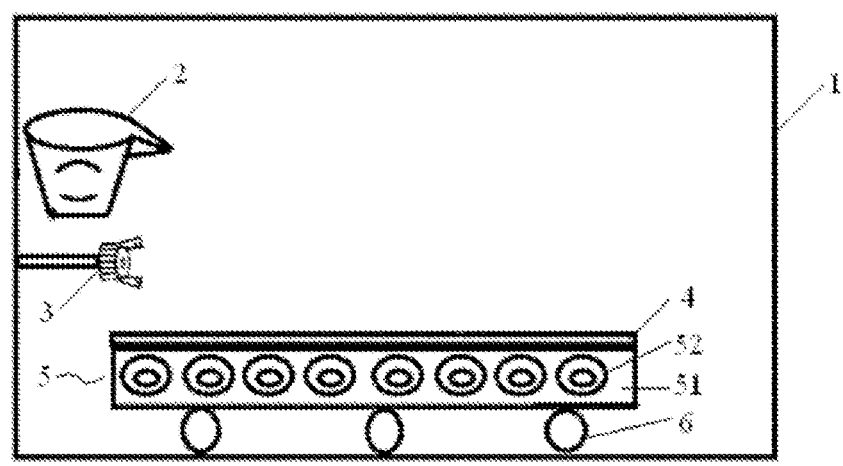
FIG. 2 is a schematic structural view of a device for manufacturing a semiconductor substrate according to an embodiment of this disclosure.

As shown in FIG. 2, the device for manufacturing a semiconductor substrate includes a sealed cavity 1, and a first heating portion 2, a thermal spraying gun 3 and a bearing portion disposed inside the sealed cavity 1. An outlet end of the thermal spraying gun 3 is disposed below an outlet end of the first heating portion 2, and the thermal spraying gun 3 may be moved relative to the bearing portion. The bearing portion has a baseplate 4, and a second heating portion 5 for heating the baseplate 4, the baseplate 4 being disposed below the thermal spraying gun 3.

The sealed cavity 1 is used to provide a sealed, dust-free and thermally insulated environment for thermal spraying. The temperature inside the sealed cavity 1 should be higher than the molten point of the semiconductor material, thereby facilitating the spraying of the semiconductor material. In addition, an thermal insulating layer is disposed on the inner wall and/or the outer wall of the sealed cavity, thereby saving energy and reducing energy consumption.

The manner in which the thermal spraying gun 3 is moved relative to the bearing portion is not specifically limited. For example, it is possible to have the bearing portion be fixed and the thermal spraying gun 3 be movable relative to the bearing portion, or have the thermal spraying gun 3 be fixed and the bearing portion be movable relative to the thermal spraying gun 3. In the case where the bearing portion is movable, a plurality of rollers may be disposed at intervals beneath the bottom of the bearing portion.

In an embodiment, the second heating portion 5 may include a heating chamber 51 and a plurality of heating rods 52. The heating chamber 51 may be disposed under the baseplate 4, and the plurality of heating rods 52 may be sequentially disposed inside the heating chamber 51 along the length direction of the baseplate 4. In this embodiment, the temperature of each of the heating rods 52 can be individually adjusted and controlled to facilitate the implementation of the cooling operation.

Further, the above setup may further include a blowing portion (not shown) disposed above the baseplate 4, the blowing portion having a blowing pipe and a blowing head disposed at one end of the blowing pipe, where the blowing head has a blowing nozzle disposed obliquely outward. The blowing portion thus disposed can blow impurities off the semiconductor substrate outwardly.

In another embodiment, the above setup may further include a blowing portion (not shown) disposed above the substrate, the blowing portion having an blowing pipe and an blowing head disposed at one end of the blowing pipe, where the blowing head can oscillate relative to the blowing pipe. The blowing portion of this arrangement is capable of oscillating and blowing impurities off the semiconductor substrate.

Further, the above setup may further include a fan, an air inlet pipe and a dust removing portion, where one end of the air inlet pipe is connected to the fan, the other end of the air inlet pipe is communicated to the sealed cavity, and the dust removing portion is disposed on the air inlet pipe. The fan, the air inlet pipe and the dust removing portion are arranged to ensure a dust-free environment inside the sealed cavity.

The structure of the above dust removing portion is not specifically limited, and can be a conventional dust removing device in the art. In one embodiment, the dust removing unit has a casing and a plurality of dust removing nets stacked within the casing. An adhesive layer is disposed on the dust removing net. This arrangement provides a good dust removal effect.

Finally, it should be noted that the above embodiments are merely intended to illustrate rather than to limit the technical solutions of this disclosure. Although this disclosure has been described in detail with reference to the foregoing embodiments, those skilled in the art will understand that the technical solutions described in the foregoing embodiments may be modified, or some or all of the technical features may be replaced by their equivalents, without causing the resultant technical solution to deviate from the scope of the technical solutions of the embodiments of this disclosure.

What is claimed is:

1. A method for manufacturing a semiconductor substrate, comprising the following steps:
    heating a semiconductor material to a molten state to obtain a molten semiconductor material;
    thermally spraying the molten semiconductor material onto a baseplate by using a thermal spraying gun, then cooling to solidify the molten semiconductor material on the baseplate to obtain the semiconductor substrate;
    wherein before the cooling, an inert gas having a temperature higher than the molten point of the semiconductor material is blown onto the molten semiconductor material on the baseplate for purification.

2. The method of claim 1, wherein the thermally spraying is controlled to a rate of 0.1-0.5 L/s.

3. The method of claim 1, wherein the cooling is controlled to a rate of 0.1-10° C./min.

4. The method of claim 1, wherein when the thermally spraying is performed, the thermal spraying gun or the baseplate is continuously moved at a speed of 0.1 to 2 m/min.

5. The method of claim 1, further comprising:
    photo-etching, or applying anti-reflecting, on the semiconductor substrate.

* * * * *